(12) United States Patent
Kliman et al.

(10) Patent No.: US 6,421,618 B1
(45) Date of Patent: Jul. 16, 2002

(54) INCIPIENT LEAKAGE CURRENT FAULT DETECTION APPARATUS AND METHOD

(75) Inventors: Gerald Burt Kliman, Niskayuna; Nicolas Wadih Chbat, Albany; Birsen Yazici, Clifton Park; Bernhard Erich Hermann Claus, Cohoes, all of NY (US); Kristofor Lynn Redinger, Erie, PA (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/222,276

(22) Filed: Dec. 28, 1998

(51) Int. Cl.[7] ................................................ G01R 31/00
(52) U.S. Cl. .......................... 702/58; 702/57; 702/59; 324/500; 324/509; 324/522; 361/42; 361/44
(58) Field of Search ..................... 702/58, 57, 59; 361/42, 43, 44, 63, 45; 324/509, 512, 522, 500

(56) References Cited

U.S. PATENT DOCUMENTS 4,370,692 A * 1/1983 Wellman, Jr. et al. ...... 361/109
4,549,241 A * 10/1985 Morris et al. ................. 361/45
6,097,580 A * 8/2000 Zaretsky ....................... 361/42

OTHER PUBLICATIONS

E. Jaske, "Ground Fault Monitoring Using Leakage Current Measurement", Power Systems World 96, 22 Pages.

McGraw–Hill Book Company, "Synchronous Motors", Motor Application and Maintenance Handbook, Chapter 5, 1969, pp. 5–20–5–22.

A. Gonzalez, Et Al, "Generator Protective Relaying", Monitoring and Diagnosis of Turbine–Driven Generators, Chap. 12, 1995, pp. 338–342.

* cited by examiner

Primary Examiner—John S. Hilten
Assistant Examiner—Hien Vo

(57) ABSTRACT

A leakage sensor determines a signal representative of a neutral-to-ground leakage current or voltage from the neutral point of an electric machine of an associated electrical system. A processor uses the sensed signal to determine incipient faults in at least one component of the electrical system.

49 Claims, 5 Drawing Sheets

INCIPIENT LEAKAGE CURRENT FAULT DETECTION APPARATUS AND METHOD

BACKGROUND

This invention relates to the field of incipient fault detection in electrical systems.

It is desirable to have early warning of insulation leakage development, in motors and drives for example, so that action may be taken before there is a trip. Failures due to traction power system leakage currents in an electrical system, such as but not limited to a dc drive locomotive, are a leading cause of system shutdown and mission failure. In a traction drive system of a dc locomotive there are many insulated windings and many un-insulated components, and electrical leakage can develop between the drive system and the frame of the locomotive over time due to aging, moisture, tracking, abrasions, and dirt, for example.

Leakage current detectors are standard on many kinds of electrical equipment to protect the equipment from damage or to protect personnel from injury, and there is extensive industrial background on leakage current monitoring by traditional methods in ac systems. The prior art includes industrial ground fault sensors and existing locomotive sensors as described, for example, in E. J. Jaske, "Ground Fault Monitoring Using Leakage Current Measurement," Conference Paper (Powersystems World 95).

However, these methods have limited sensitivity, particularly for the dc portion of the system, and often utilize aggregate signals that make it impossible to localize the specific portion of the system in which failure is imminent.

SUMMARY OF THE INVENTION

It is therefore desirable to improve sensitivity of leakage detection in electrical systems to enable incipient fault detection (IFD) and, in some cases, to enable localization of the problem.

It is further desirable to reduce locomotive mission failures and reduce maintenance costs.

Briefly, according to one embodiment of the present invention, an apparatus for predicting incipient faults in an electrical system including an electric machine comprises: a leakage sensor determining a neutral-to-ground leakage signal representative of current or voltage between a neutral point of the machine and an electrical ground; and a processor receiving the leakage signal, extracting at least one component of the leakage signal, and using the extracted signal component to predict incipient faults in at least one portion of the electrical system.

According to another embodiment of the present invention, an apparatus for predicting an incipient fault in an electrical system including an electric machine comprises: a leakage sensor determining a leakage signal representative neutral-to-ground leakage current or voltage between a neutral point of the machine and an electrical ground; and a processor periodically receiving the leakage signal, normalizing the leakage signal to a machine voltage yielding a representative leakage impedance, and examining a resulting plurality of data points of the representative leakage impedance over time to predict the incipient fault.

According to another embodiment of the present invention, an apparatus for predicting an incipient fault in an electrical system including an electric machine comprises: a leakage sensor determining a neutral-to-ground leakage signal representative of current or voltage between a neutral point of the machine and an electrical ground; and a processor periodically receiving a plurality of data points of the leakage signal over time for predicting the incipient fault. The processor predicts the fault by: preprocessing the data points to reduce transient effects and noise; averaging the preprocessed data points; forming the averaged data points into overlapping windows; and, in each window, using the averaged data points to estimate regression model parameters and using the regression model parameters to forecast a time at which the incipient fault will occur.

BRIEF DESCRIPTION OF THE DRAWING

The features of the invention believed to be novel are set forth in the appended claims. The invention, however, together with further objects and advantages thereof, may best be understood by reference to the following description taken in conjunction with the accompanying drawings in which:

DETAILED DESCRIPTION OF THE INVENTION

Figure 1:
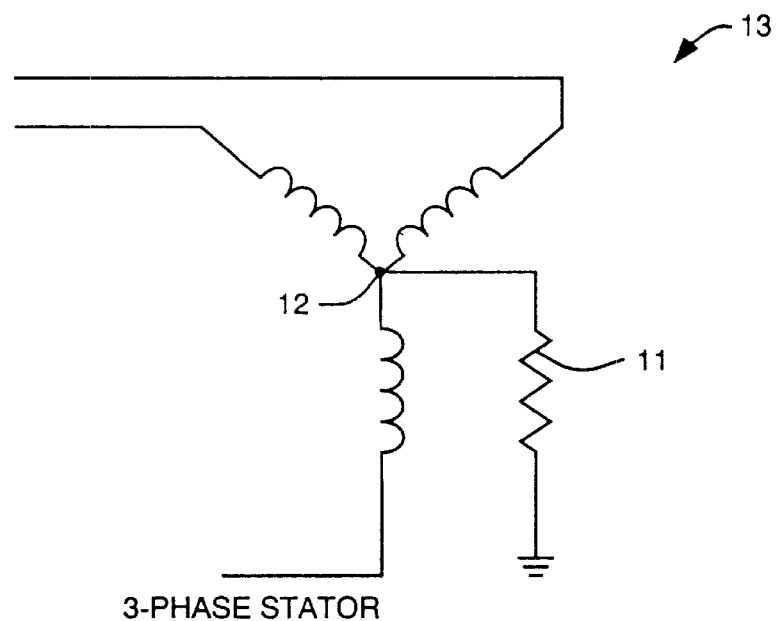
FIG. 1 is a circuit diagram illustrating the prior art using a "Y" (wye) or star connected motor or generator with a current sensor including a resistor from neutral to ground.
Figure 2:
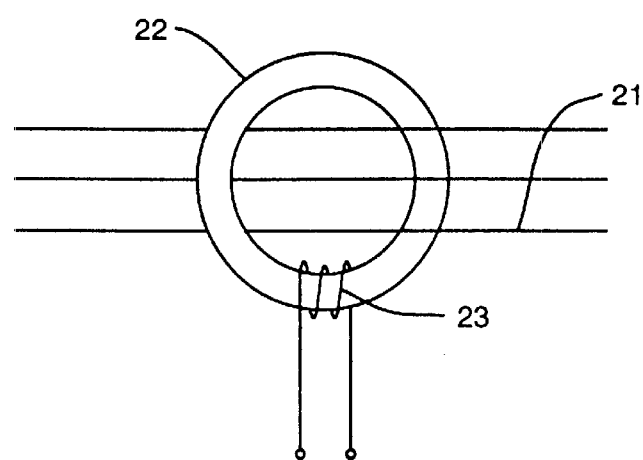
FIG. 2 is a circuit diagram illustrating the prior art feeding a load through a ore of a transformer with a sensing winding.

Two common forms of prior art leakage monitoring implementations are shown in FIGS. 1 and 2. FIG. 1 utilizes a leakage current sensor 11, which may comprise a resistor, for example, from the neutral point 12 of a "Y" (wye) connected motor or generator 13 to ground. Current will flow in current sensor 11 whenever a ground develops anywhere else in a system connected to motor or generator 13. This current is then monitored so that warnings or trips may be enabled when the leakage current reaches predetermined levels.

Another common form for leakage monitoring is shown in FIG. 2 where wires 21 (two, three or more) feeding a load are brought through a transformer core 22. As long as no current flows to ground, the instantaneous sum of all the currents is zero and there is no flux in transformer core 22. When some current flows to ground instead of through the core, there will be flux and a signal will appear on a sense winding 23.

There are several limitations to the embodiments of FIGS. 1 and 2. For example, there will always be current to ground due to stray capacitance in the motor and in the systems connected to it. There may also be multiple sources of leakage in the system which are mixed together in the current sensor. Further, leakage current depends on the voltage level of the system, and conventional methods generally only provide sensitive protection when the voltage is at its highest level. Additionally, interference (noise) signals from outside sources can get mixed into the detected signal.

Figure 3:
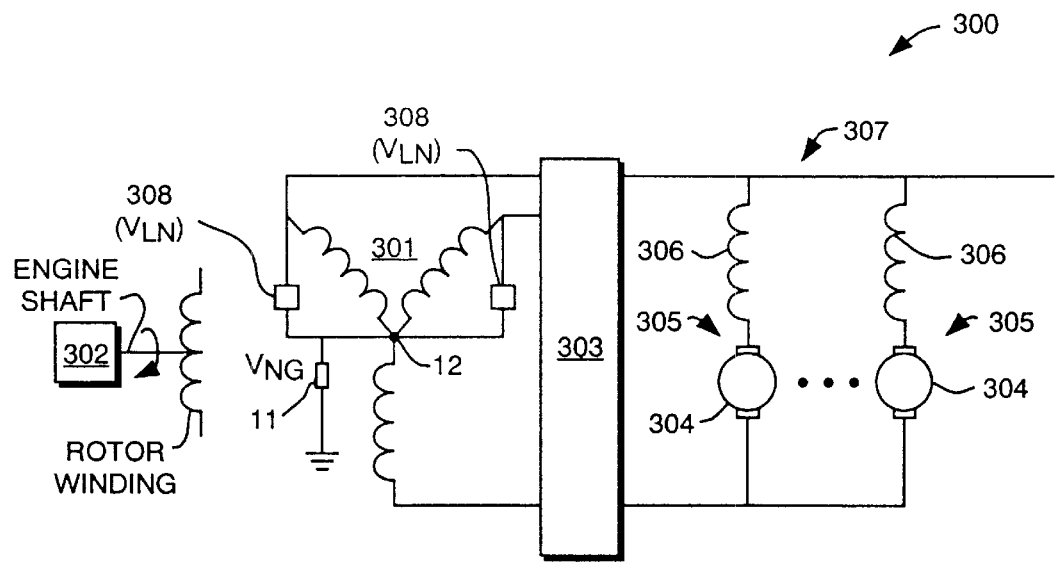
FIGS. 3 and 4 are circuit diagrams illustrating a propulsion drive system for a typical dc locomotive, with various sensing components added to provide sensing information used according to several embodiments of the invention.
Figure 4:
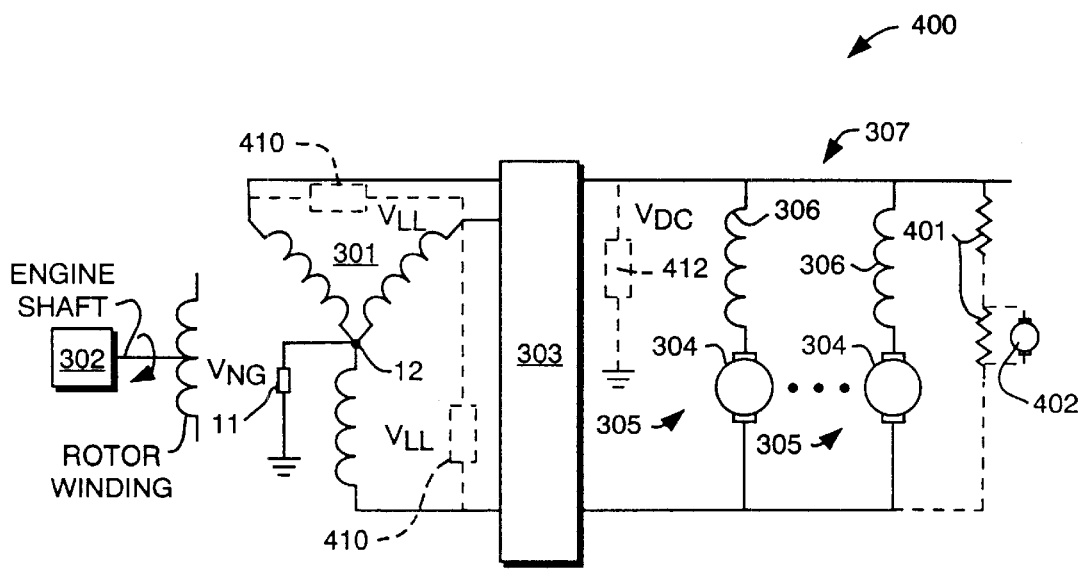

FIGS. 3 and 4 are circuit diagrams of an electrical system which, for purposes of example, comprises a propulsion drive system for a typical dc drive locomotive, with various sensing components added to provide sensing information used according to several embodiments of the invention, and FIG. 5 is a flowchart illustrating the various techniques for fault detection of the present invention. The present invention is not limited to the propulsion drive system context.

Propulsion drive system 300 is shown in FIG. 3, where a three phase machine 301 (which may comprise a motor or generator, for example, and in the locomotive embodiment of FIG. 3 comprises an alternator) is driven by a prime mover such as a diesel engine 302. Tractive effort is modulated by varying the field, hence the voltage, of machine 301. The three phase voltages are then full-wave rectified by rectifier 303 to produce dc voltage with a ripple as there is usually no filtering except for the inductance of traction motors 305. Traction motors 305 are usually series field dc traction motors with armatures 304 and main poles 306. There are typically four or six traction motors in a locomotive, depending on the application, connected in parallel on a dc bus 307 across the rectified dc source. Not shown in FIG. 3 are dynamic braking resistors and contactors used for reversing or for braking. Leakage current is monitored as in FIG. 1 by sensor 11 connected between neutral 12 of machine 301 and the locomotive frame (ground in this embodiment) since such leakage in any part of the system must flow through sensor 11. The current that passes through sensor 11 is the leakage current, and the voltage across it is neutral-to-ground voltage $V_{NG}$.

Each subsystem in the propulsion drive system has a characteristic frequency. For example, machine 301 voltage will have a frequency dependent on the speed of diesel engine 302 and the number of poles on machine 301. The dc bus 307 will have both zero frequency (dc) and a considerable ripple at six times the machine 301 frequency. Traction motors 305 will have a variety of frequencies, particularly, once per revolution and four (if a four pole motor is used) per revolution, and rotor slot passing and commutator bar passing frequencies which may be several kHz.

The existence of different frequencies associated with these various subsystems can be exploited to further increase sensitivity and to approximately localize the leakage. For example, machine 301 voltage can be used to separate out the resistive components of the fundamental frequency leakage current. In a similar manner components associated with rectifier 303 or cabling (not shown) can be separated out using the frequency of the ripple voltage. It may be advantageous in some systems to sense the dc bus 307 voltage, as shown in FIG. 4, to aid in separating out the ripple component. Slot and bar passing frequencies will be associated with leakages in the motors. The main tool for extracting selected components comprises a complex fourier transform but less computationally intensive techniques may be employed when less extensive information is required.

Various traction motor 305 frequencies identify currents (such as Icom—the current magnitude at the commutation or bar-passing frequency, or Islot-the current magnitude at the slot passing frequency) whose magnitude, if increasing, could be indicative of a developing problem in the traction motor. Whether or not to use these frequencies, or which frequencies to use in a given situation, is predetermined based on factors such as processor capabilities, how important the potential fault is deemed to be, and how well the databases and algorithms have been developed.

All of the described functions can be implemented as subroutines in a processor/computer 513 (shown in FIG. 5) comprising analog or digital elements, or a combination of both. As further discussed below with respect to FIG. 5, signals representing machine 301 voltage (line-to-line voltage or line-to-neutral voltage) and leakage current can be used as input signals. The fourier transforms (or other fundamental extraction techniques) can be done by the processor. Diesel engine speed and traction motor speed can also be used to aid in identification of the relevant spectrum components. Also, as an aid to the analysis, the operating mode (motoring, dynamic brake, etc.) can be used as well.

Ground faults may occur as a result of a fault in any of a number of different system components. In the context of a locomotive, such components include the propulsion drive system, batteries, and auxiliary equipment. Within the propulsion drive system, ground faults can occur in one or several components which include alternator, rectifier, cabling, traction motor, dynamic brake resistor, and blower motor. Although the data to be collected for ground fault detection is sensed at the machine 301 neutral, the leakage current signal may point to one or more of the aforementioned components.

In FIG. 3, at least one machine voltage sensor 308 senses a line to neutral voltage $V_{LN}$ of machine 301. If two voltage sensors 308 are used, a common mode voltage signal can be calculated.

In an alternative embodiment 400 shown in FIG. 4, several additional elements (in broken lines) are added to or modified with respect to the propulsion drive system of FIG. 3. FIG. 4, like FIG. 3, illustrates a propulsion drive system for a dc drive locomotive system. FIG. 4 further illustrates braking grids 401 and blower motor 402. The braking grids 401 are parallel resistors used to dissipate heat energy during dynamic braking of the locomotive.

The dotted lines and components illustrate voltage sensors 410 and 412. As in FIG. 3, contactors are not shown in FIG. 4. At least one machine voltage sensor 410 is used to measure a line-to-line voltage $V_{LL}$ of machine 301, and a dc voltage sensor 412 can be used to measure the dc voltage $V_{DC}$ to ground. Two $V_{LL}$ sensors 410 shown in FIG. 4 can be used to determine a common mode voltage, which is an alternative to determining the common mode voltage by using the two $V_{LN}$ sensors 308 illustrated in FIG. 3. Similarly, where only one line voltage is used and resistive and capacitive components of the leakage current are computed, either a single one of the $V_{LL}$ sensors 410 can be used, or a single one of the $V_{LN}$ sensors 308 may be used. Although two sensors are shown in machine 301 in each of FIGS. 3 and 4, it is understood that when only one voltage is used, only one sensor is needed.

Figure 5A:
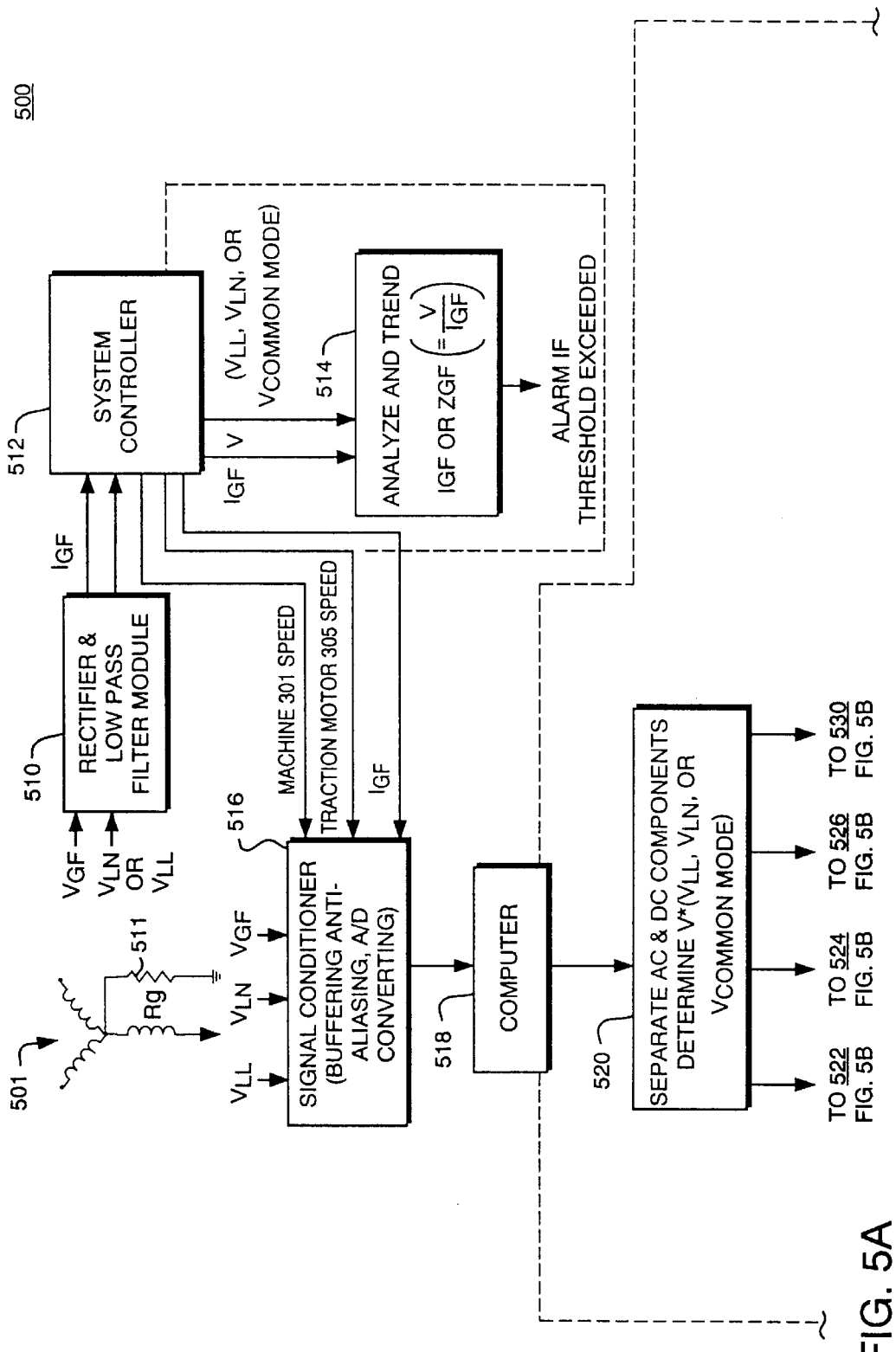
FIGS. 5A–5B are a flowchart illustrating various techniques for fault detection of the, present invention.
Figure 5B:
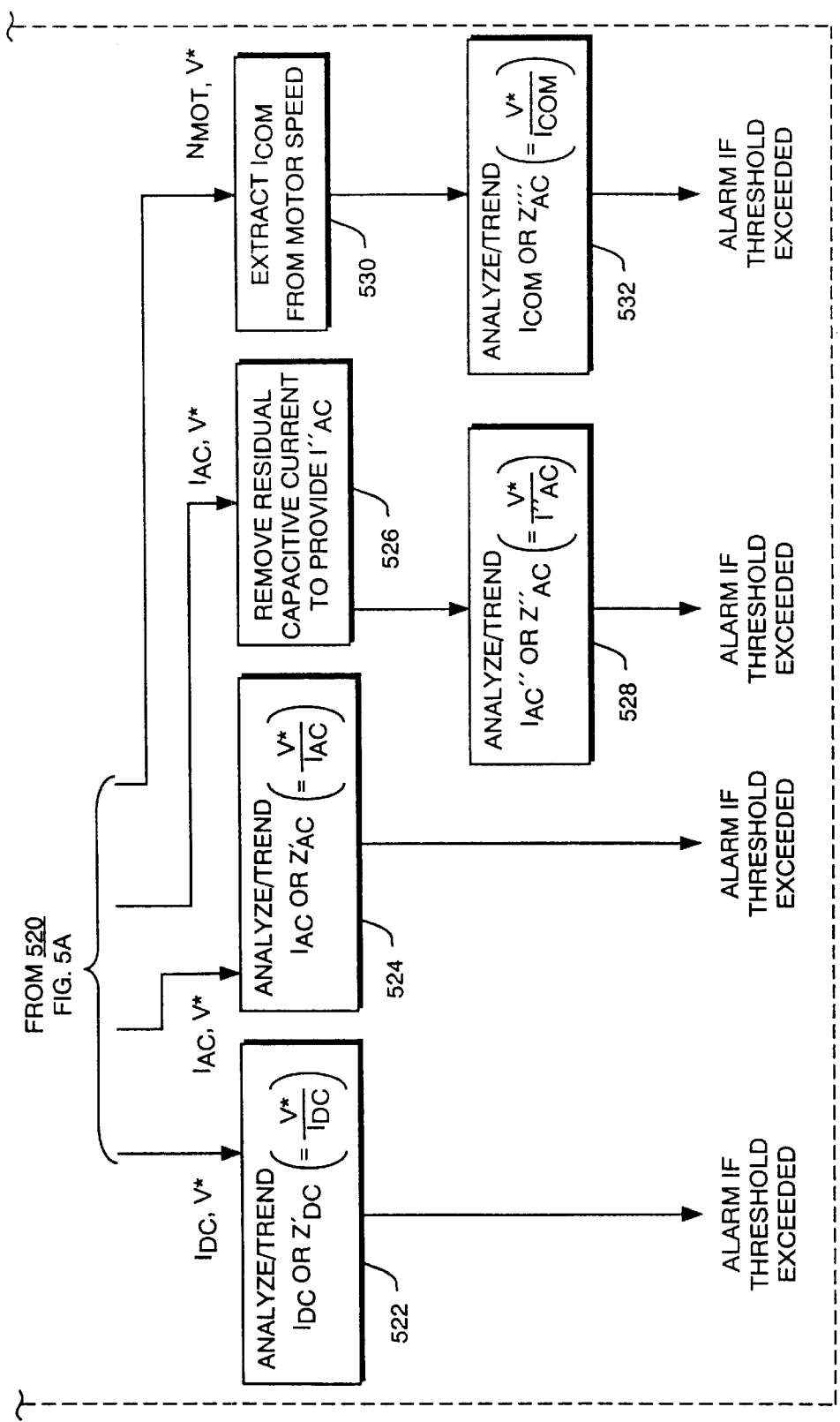

Referring now to FIGS. 5A–5B, leakage current of a three phase machine 501 is measured with sensor 511, rectified and filtered by a rectifier/low pass filter module 510, and analyzed by a system controller 512 which may include an analysis/trending block 514. All measurements for deducing incipient ground faults start with the leakage current sensor 511 (with voltage $V_{NG}$) from the neutral of machine 501 to the frame (ground). There are a number of different alternative analysis paths leading to analysis/trending blocks 514 (of system controller 512) and 522, 524, 528, and 532 (of a computer 518) that can be considered separately or in combination. One of the analysis paths (block 514) relates to the leakage current and a representative impedance, whereas the remaining analysis paths relate to currents and representative impedances which have been separated into various extracted components. Although the description of FIGS. 5A–5B are primarily in terms of leakage current for purposes of example, the current is proportional to leakage voltage, so either current $I_{GF}$ or voltage $V_{GF}$ can be used as a "leakage signal."

Although the analysis paths are shown as being separate, the system controller 512 and computer 518 layout is only for purposes of example. A processor 513 may include all or some of the conditioning and analysis/trending blocks shown in FIGS. 5A–5B are regardless of the layout. Furthermore, not all of the analysis/trending options require a machine voltage be sensed from sensor 308 or 410.

In one embodiment, turning to a first analysis path represented by analysis/trending block 514, leakage current $I_{GF}$ and/or a representative impedance $Z_{GF}$ is trended to predict faults. In this embodiment module 510 takes the voltage across the current sensor 511 and full wave rectifies and low pass filters it with, for example, about a ⅓ Hz cut-off yielding a slowly varying (essentially dc) voltage level. The output signal $I_{GF}$ of module 510, which is proportional to the aggregate leakage current, is then trended in analyze/trending block 514 of system controller 512. By extrapolation, the time of reaching the first alarm threshold may be estimated.

To extend the usefulness of the measurement to other than maximum voltage, the output signal $I_{GF}$ can normalized to the machine 301 voltage resulting in a "pseudo-impedance" $Z_{GF}$. This pseudo-impedance is proportional to a measure of the net or average leakage impedance to ground of the system. Current to ground, whether resistive or capacitive, is driven by the voltage to ground. The capacitive component will often be driven by the common mode voltage. In some electrical systems the common mode voltage will be proportional to the machine voltages. Hence, normalizing the leakage current to the machine voltage can be used to yield a measure of the impedance magnitude to ground rather than just the net current. In summary, the pseudo-impedance can be obtained by selecting a voltage signal representative of a common mode voltage, a line-to-line voltage, or a line-to-neutral voltage and dividing it by the leakage current. Alternatively, if a machine voltage value is available from another source such as an electrical system controller (not shown), this value can be used to calculate the impedance. A quantity proportional to the leakage impedance may then be trended to reveal a developing problem even if the net current magnitude has not reached a trigger level and if the system is at other than maximum voltage.

Ground faults resulting from insulation defects and deterioration generally develop over time, on the order of days, before they cause any damage, i.e., before the leakage current reaches a critical level. The relationship between non-insulation related faults and the time it takes for them to cause a locomotive shutdown is not fully understood yet. Flashovers, for instance, may cause an instant shutdown in addition to subsequent insulation deterioration. Consequently, it would be useful to predict the ground faults that have a failure time constant of a minimum of several hours, assuming that readings are taken at the typical logging rate of once every few hours or half hours, for example. The following is a discussion of different types of trending of the present invention that can be used, for example.

One type of trending is leakage current based trending. The leakage current I is viewed in discrete samples that are separated by a predetermined time period T (in one embodiment T=1 hour, for example). The goal is to detect the leakage current before it reaches a predetermined level $L_1$, which in one embodiment, for example, is 750 ma. The leakage current can be monitored for increases in the following manner, for example:

First, the ratio $a_1(k)$ and or the difference $a_2(k)$ is determined with at least one of the following equations:

$$a_1(k) = I(k)/I(k-1)$$

and/or $$a_2(k) = I(k) - I(k-1),$$

wherein I(k) is the leakage current at sampling index time k, and I(k−1) is the leakage current at the previous sampling index time (predetermined time period T earlier).

Then it is determined whether the ratio $a_1(k)$ and/or the difference $a_2(k)$ is remaining relatively constant by evaluating at least one of the corresponding following equations:

If $a_1(k) = a_1(k-1) \pm \epsilon_1$ for k=m to n, then the ratio is relatively constant.

If $a_2(k) = a_2(k-1) \pm \epsilon_2$ for k=m to n, then the difference is relatively constant.

where m and n (m<n) generally are integer multiples of the period T defining a time span including a number of sample points, and $\epsilon_1$ and $\epsilon_2$ are predetermined boundary constants. The difference n−m represents a fixed time span or number of sample points S which may be different for $a_1(k)$ and $a_2(k)$. Furthermore S may be progressively changed through the sample points in order to discern trends. In one embodiment, the minimum number of data points that must be collected for the ratio or difference to be considered relatively constant is three or four, for example, but any desired number can be selected. If the difference and/or ratio is relatively constant in this manner, then the time to expected damage (that is, the time until the current is expected to reach level $L_1$) can be extrapolated by a linear extrapolation or by a higher order extrapolation, for example.

Additionally, it can be determined whether the ratio $a_1(k)$ and/or difference $a_2(k)$ is increasing at an accelerated rate by evaluating at least one of the following equations:

If $a_1(k)/a_1(k-1) > 1+\beta_1$, for k=m to n, then the ratio is increasing at an accelerating rate.

If $a_2(k)/a_2(k-1) > 1+\beta_2$, for k=m to n, then the difference is increasing at an accelerating rate.

where difference n−m again generally represents a fixed time span S which may be different for a1(k) and a2(k), and $\beta_1$ and $\beta_2$ are predetermined boundary constants. In one embodiment, if I(k) for each k less than n is less than the I(k) for k being equal to n, then a curve of current versus time can be fit through the last n−m a(k)'s, and it can be determined at what point in time the curve will pass through the predetermined level $L_1$. In another embodiment, the last difference (at k=n) can be extrapolated to determine when the current will reach the predetermined level $L_1$. Again, a selected number of data points for the ratios or differences can be chosen.

It may be useful to review multiple ratios or differences simultaneously. For example, a ratio or difference a(k) can be used to measure short term changes, with a ratio or difference b(k) measuring longer term changes, and a ratio or difference c(k) measuring still longer term changes. In one embodiment, for example, the predetermined time period T for evaluation of ratio or difference a(k) is 1 hour, the predetermined time period for evaluation of ratio or difference b(k) is 6 hours, and the predetermined time period for evaluation of ratio or difference c(k) is 12 hours. The ratios and differences evaluated over several time periods may have different noise and tolerance constants. This is useful because early obvious faults can be determined quickly with the shorter term analysis while more slowly developing faults can be detected by the longer term analysis.

Another type of trending is trending of the pseudo-impedance Z(k). The impedance can be trended using the same types of sloping and/or difference analysis and equations as discussed above with respect to the current. In the claims the H is meant to represent current I or impedance Z. Because impedance depends on the operating mode of an electrical system, impedance trending takes into account such factors as whether the locomotive is motoring or braking, and for the power setting, speed and other factors such as humidity and temperature. Since voltage is monitored and logged, it is possible using field test data to build a lookup table for different voltages and locomotive statuses to generate the correct alarm for ground faults.

An additional type of trending is fault log based analysis. This method trends the type, frequency and rate of fault logs for a particular unit and can predict the approach of a more significant fault or failure occurrence using at least one of the following equations:

For $d_1(j)=F(j)/F(j-1)$, if $d_1(j)<=1+\alpha$ for a preselected number of samples $N_3$, then the ratio of the operational times is decreasing, For $d_2(j)=F(j)-F(j-1)$, if $d_2(j)<=1+\alpha$ for a preselected number of samples $N_4$, then the difference of the operational times is decreasing, wherein j is an index of fault log occurrences; F(j) represents the time period the locomotive was operational between the present (jth) fault log and the previous (j−1th) fault log; F(j−1) represents the time period the locomotive was operational between the two previous fault logs (the j−1th and j−2th fault logs); $d_1(j)$ represents the ratio trending coefficient of these time periods; $d_2(j)$ represents the difference trending coefficient of these time periods; $N_3$ or $N_4$ represents the minimum number of times before that the ratio or difference increases prior to the warning or alarm; and $\alpha$ is a predetermined boundary constant which may differ for $d_1(j)$ and $d_2(j)$.

If either equation is true, then an action such as a warning, alarm, or automatic shutdown may be performed. In one embodiment, there can be different levels of "faults". For example, fault logs/warnings can be generated by a current at one level (such as 750 ma, for example) and used to predict when the current may reach a second more dangerous level (such as 1000 ma, for example). At the second level, the processor can take a preventive action of reducing the voltage of machine 501. A third and higher level (such as 2000 ma, for example) can be used as a machine shutdown level.

Another alternative type of trending, which can be used either with current or pseudo impedance data, includes cleaning the data, averaging the data, and analyzing the averaged data using a model based regression technique to forecast the timing of a predicted ground fault. Although pseudo impedance trending is preferred and used in the following description, the analysis is analogous when applied to current trending.

In this embodiment, periodic collection and monitoring of leakage current data points is performed. In one embodiment, one sample is taken every three seconds, for example. High frequency sampling is not required, and, in other embodiments, samples are taken at periods on the order of minutes or hours. For pseudo impedance based trending, each current sample is converted to a representative pseudo impedance. As discussed above, pseudo impedance data is sorted with respect to different operating conditions (modes) such as motoring, braking and possibly different engine speeds. For each mode, the following process can be used to generate a prediction as to the time remaining before a ground fault. In one embodiment, the conclusive prediction is the minimum of the predictions obtained from the different operating mode predictions.

First, in a preferred embodiment, the raw pseudo impedance data is cleaned (preprocessed) to reduce transient effects and noise from factors such as humidity, for example. Although not required, some type of cleaning is useful to prevent transient effects from creating erroneous results in successive trending. Cleaning can be performed for all data, or, in another embodiment, cleaning is only performed if an independent source, such as a humidity sensor, for example, indicates that the data includes transient effects. For cleaning, the raw data is formed into overlapping data cleaning windows (preferably with no more than a twenty-five percent overlap). The length of each data cleaning window depends on the duration of the transient effect. For example, if it is raining, several hours worth of data may be useful. A "median trimming" technique can be used to remove outliers by computing the median of the data within the data cleaning window and replacing a percentage, such as 10–20%, for example, of the extreme values, particularly large extreme values, by the median value.

After data cleaning, a model based regression technique can be used to forecast when the ground fault will occur (in terms of remaining days, hours, min. etc.) using the raw or, if applicable, preprocessed pseudo impedance data or selected harmonics of the pre-processed pseudo impedance data.

The regression technique first averages the data and then forms the averaged data into overlapping (or sliding) regression windows. The length of an individual data averaging window is chosen to be short enough so that the deterioration rate is relatively constant and long enough so that the regression parameters can be estimated accurately. For example, if data is collected every three seconds, data can be averaged in a sequential manner to get one averaged data point every minute or hour, for example. The averaging length will depend on the desired resolution of the prediction/forecasting and the noise level. After a predetermined number of averaged data points are collected, a resulting data regression window formed by the averaged data points can be analyzed. In one embodiment, for example, at least 100 averaged data points are formed to accurately estimate 3–4 regression parameters.

The averaged data points within a present data regression window are used to estimate regression model parameters. One possible regression model is a "linear model". Another possible model is a "quadratic model". These models respectively assume a linear and a quadratic relationship between the time and the data.

For purposes of example, the regression analysis is described below with respect to the following linear model:

$$Z(t_i)=At_i+B+\rho\omega(t_i), i=1, \ldots, L$$

wherein z is the pseudo-impedance data, $t_1$ is the time instance at which the pseudo-impedance data $Z(t_i)$ is collected, L is the length of the data regression window, $\omega(t_i)$ is a zero mean unit variance noise, and (A,B,ρ) are regression parameters to be estimated.

One method of estimating regression parameters is the "linear least squares technique":

$$\hat{\theta} = \left[\sum_{i=1}^{L} Q_{t_i} Q_{t_i}^T\right]^{-1} \left[\sum_{i=1}^{L} Q_{t_i} Z(t_i)\right], \text{ and}$$

$$\hat{\rho} = \sqrt{\frac{1}{L-1} \sum_{i=1}^{L} (Z(t_i) - \hat{\theta}^T Q_{t_i})},$$

wherein $Z(t_i) = \theta^T Q_{t_i} + \rho \omega(t_i),$ $\theta = [A\ B]^T,$ $Q_{t_i} = [t_i\ 1]^T$ for $i=1, \ldots, L$ and wherein $\hat{\theta}$ and $\hat{\rho}$ are estimates of $\theta$ and $\rho$, respectively. The estimation of least squares coefficients can be accomplished in a sequential manner to reduce computational load.

A mean and a standard deviation can be determined for the threshold of the pseudo impedance at which ground fault may occur for a given operating condition. These threshold values can be determined either by field experience or by evaluating the impedance levels corresponding to a predetermined leakage current (which in one embodiment, for example, is 750 ma) and full voltage scenario in a number of electrical systems (preferably at least five). A ground fault can occur anywhere between $M_{Thr} - d\sigma_{Thr}$ and $M_{Thr} + d\sigma_{Thr}$ wherein $M_{Thr}$ and $\sigma_{Thr}$ are mean and standard deviation of the threshold, and wherein d is a predetermined constant. In one embodiment, d is selected to be three, for example.

The regression model and the estimated regression parameter values $\hat{A}$ and $\hat{B}$ can be used to forecast remaining time to failure $T_{est}$ as follows:

$T_{est} = (M_{Thr}/\hat{A} - \hat{B}/\hat{A}) - t_p$ wherein $t_p$ is the present time.

When a new averaged data point is collected, the first point in the present data regression window can be dropped, and the new averaged data point can be added to the last slot to complete a new data regression window. Then new regression parameters can be estimated using the new data regression window to update the forecast.

The new data regression window can alternatively be completed by dropping and adding more than one point at a time. In this situation, N points from the beginning of the prior data regression window will be dropped and N new points will be added to form the new data regression window where N is preferably not larger than twenty-percent of the length of the data regression window.

In one embodiment, the accuracy of the predicted time to failure can be calculated by studying the variance of the prediction(forecast) which involves using a Taylor series expansion of the prediction equation around the estimated regression parameters so as to obtain a sensitivity equation. The sensitivity equation involves computing the variance of the prediction in terms of the variance of the estimated regression parameters using the first order Taylor series expansion:

$\sigma T_{est}^2 = \sigma_{Thr}^2/\hat{A}^2 + \sigma_{\hat{A}}^2/\hat{A}^4 + \sigma_{\hat{B}}^2/\hat{A}^2.$ The variance of the estimated regression parameters for the above equation can be calculated as follows:

$$\sigma_{\hat{B}}^2 = [\hat{\rho}^2(L-1)] / \left[(L-2)\sum_{i=1}^{L}(t_i - \bar{t})^2\right], \text{ and}$$

$$\sigma_{\hat{A}}^2 = \left[\hat{\rho}^2(L-1)\sum_{i=1}^{L} t_i^2\right] / \left[(L-2)L\sum_{i=1}^{L}(t_i - \bar{t})^2\right],$$

wherein $\bar{t}$ is the sample average of time instances $t_i$. I.e., i=1, ..., L.

Alternatively the accuracy of the predicted time to failure can be calculated by studying the variance of the regression parameter estimates and forming a confidence region of (100-2P)% along the prediction line which is given by the following equation:

$$\hat{A}t + \hat{B} \pm \tau_c \left(\frac{\hat{\rho}(L-1)}{(L-2)}\right) \sqrt{\frac{1}{L} + \frac{(t-\bar{t})^2}{\sum_{i=1}^{L}(t_i - \bar{t})^2}}$$

wherein $\bar{t}$ is the sample average of time instances $t_i$. I.e., {N,N+1, ..., L+N} and $\tau_c$ is such that for the t-distributed random variable $\tau$ with L-2 degrees of freedom has P% chance that $\tau > \tau_c$. In one embodiment, for example, P is selected to be 2.5 for a 95% confidence interval. In this embodiment, the confidence limits on the prediction are provided by solving the following equation for t:

$$M_{Thr} = \hat{A}t + \hat{B} \pm \tau_c \left(\frac{\hat{\rho}(L-1)}{(L-2)}\right) \sqrt{\frac{1}{L} + \frac{(t-\bar{t})^2}{\sum_{i=1}^{L}(t_i - \bar{t})^2}}.$$

Simulated data was used to test this regression based trending technique. In the simulation, one averaged data point of preprocessed pseudo impedance was set to be formed per day, and a ground fault was set to occur at $140^{th}$ day. The mean and standard deviation of the threshold impedance were chosen to be 1000 Ohms and 100 Ohms respectively with the fault region of the pseudo impedance being designated from 700 Ohm to 1000 Ohm. A data regression window length of twenty days (twenty averaged data points) with two days of sliding overlap was used, and the prediction was updated at every two days (every two averaged data points). Initial predictions of time to fault were higher than the true time to fault due to the degradation being very slow. As the ground fault approached, starting from day 105 (the $105^{th}$ averaged data point), the predictions fell consistently in the fault region and progressively became more accurate In FIGS 5A–5B, a different analysis path than that of block 514 leads to signal conditioner 516 which includes conventional buffers, antialiasing filters, and analog-to-digital converters for conditioning the signals and supplies conditioned signals to a computer 518 which includes a component processing block 520 for separating ac and dc components of the leakage current signal $I_{GF}$ and supplying a component to at least one analysis/trending block 522, 524, 528, and/or 532. This analysis path treats the raw signal from the current sensor 511 in several different ways. Component processing block 520 transforms the current signal into a current spectrum by a technique such as a fourier transform and determines the ac and dc components of the current signal.

In analysis/trending block 522, the dc component $I_{DC}$ of the current signal (or the pseudo-impedance $Z'_{DC}$) is then treated in a manner similar to the leakage current signal $I_{GF}$ (or $Z_{GF}$) as described above with respect to analysis/trending block 514 to indicate developing problems in the dc portion of the machine 501 or propulsion drive system.

In the embodiment block 522, $Z'_{DC}$ is calculated by dividing a selected voltage V* by dc current component $I_{DC}$. In this embodiment, V* is one of a line-to-line voltage from sensor 410, a line-to-neutral voltage from sensor 308, or a common mode voltage (derived from two line-to-line voltages or two line-to-neutral voltages as noted above).

In analysis/trending block 524, the ac fundamental component $I_{AC}$ of the current signal (or the pseudo-impedance $Z'_{AC}$) is then treated in a manner similar to the leakage current signal $I_{GF}$ (or $Z_{GF}$) as described above with respect to analysis/trending block 514 to indicate developing problems in the ac portion of the machine 501 or propulsion drive system. The ac fundamental component $I_{AC}$ can be identified by use of a machine speed which determines the machine frequency. For example, a speed of machine 301 such as shown in FIG. 3 can be determined by multiplying the speed of engine 302 (FIG. 3) in rpm by one-half the number of machine poles and dividing the result by 60. Then $I_{AC}$ can be determined by finding the value of $I_{GF}$ at the machine frequency.

To determine pseudo-impedance $Z'_{AC}$ in the embodiment of block 524, V* is one of a line-to-line voltage from sensor 410, a line-to-neutral voltage from sensor 308, or a common mode voltage (derived from two line-to-line voltages or two line-to-neutral voltages as noted above).

If both blocks 522 and 524 are used, these paths break down the leakage current signal into its contributory sources and track each individually instead of mixing the dc and ac sources together.

In block 528, the resistive portion of the ac component is analyzed/trended after being extracted in block 526. The ac component includes resistive and capacitive current. Capacitive current is considered normal (and the capacitance is generally constant within different operating modes of machine 501 but the net capacitance will vary with mode) but will tend to mask the early stages of resistive leakage. The capacitive component may be eliminated by utilizing knowledge of the machine voltage. If two or more machine voltages are available, the common mode voltage may be calculated. In particular, the common mode voltage is readily determined as is known in the art by sensing line-to-neutral voltages $V_{LN}$ with sensors 308 between two lines of machine 501 and the machine neutral 12 as illustrated in FIG. 3, or alternatively, by sensing line-to-line voltages $V_{LL}$ with sensors 410 between two pairs of lines of the machine as illustrated in FIG. 4. The resistive component may have common mode components but will also be sensitive to maximum voltages. Thus, to isolate the resistive component of the leakage current, the leakage current in phase with the common mode voltage can be tracked as $I''_{AC}$. The resistive components are important for monitoring leakage and these should be zero or very small for a new dry system or a dry system in good condition. Hence the sensitivity will be much improved.

Figure 6:
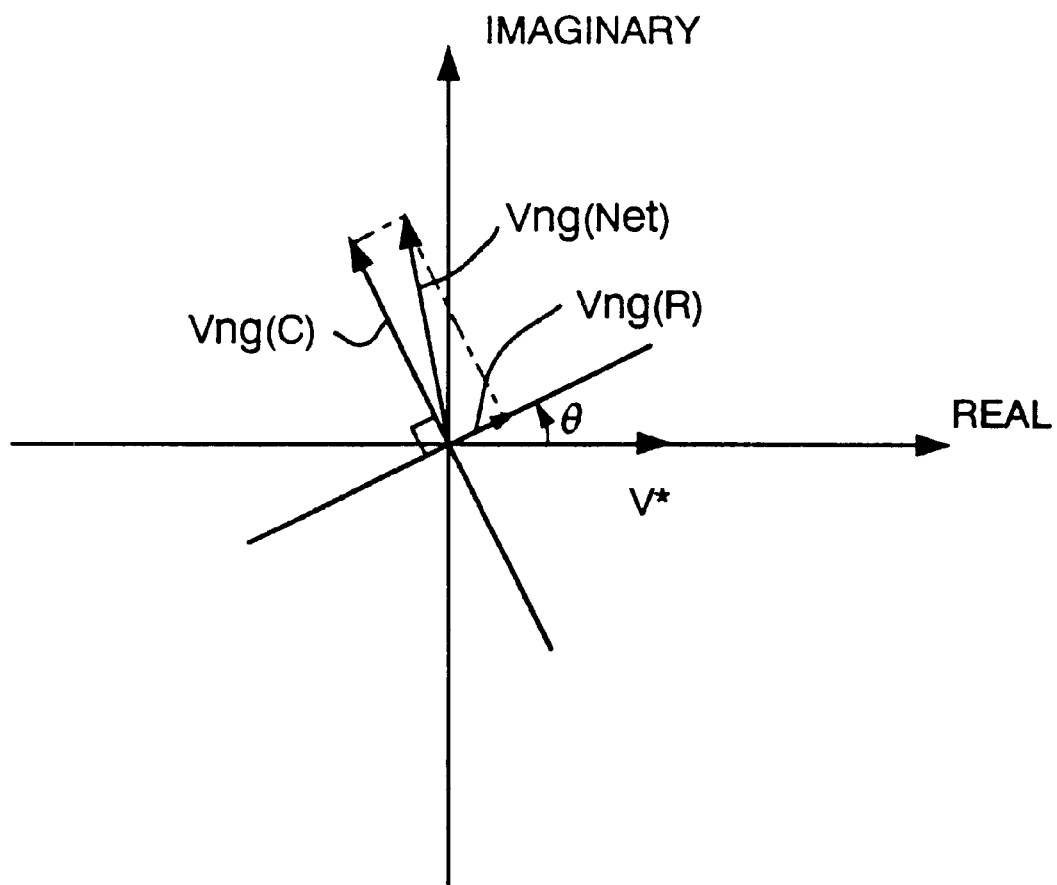
FIG. 6 is a phasor diagram illustrating the separation of capacitive and resistive voltage components.

FIG. 6 is a phasor diagram illustrating another technique for removing the capacitive component and determining the resistive component of a voltage signal. The voltage between the neutral and the ground $V_{NG}$ has two components, namely, capacitive component $V_{NG}$ (C) and resistive component $V_{NG}$ (R). These components will be 90 degrees out of phase if an electrical system is symmetric (which it will be if it is in good condition, clean and dry) or symmetrically deteriorating (as it would be in most cases except for an accidental or random fault). The capacitive component always exists and the resistive component, if present, is very small at the outset.

Since most of the capacitive component will be in machine 501 or 301, ac fundamental components are most useful. To do this, assuming the system is in good condition, clean, and dry, $V_{NG}$ (R)~0, the voltage signal is essentially all at angle θ plus 90 degrees hence angle θ may be identified by measuring a value of $V_{NG}$ when machine 501 is known to be running in a good condition and determining θ to be the angle between $V_{NG}$ and the imaginary axis. It is then possible to later extract only components of the leakage current along an axis off the real axis by angle θ, i.e., the resistive component. If an unsymmetric fault occurs, the angle will be different, which will reduce the sensitivity of this method. However, at early stages of deterioration an electrical system will typically be under symmetric conditions.

In another embodiment, if it is not possible to derive the common mode voltage or if the capacitive component is more driven by a line-to-line or line-to-neutral voltage, a single line-to-line or line-to-neutral voltage can be used by computing resistive and capacitive components of the leakage current with a signal derived from that voltage, either using a single one of the $V_{LN}$ measurements 308 of FIG. 3, or using a single one of the $V_{LL}$ sensor 410 measurements of FIG. 4. Then, assuming that the system is in good condition, the phase of the current signal is varied until the resistive component of the $V_{LL}$ or $V_{LN}$ is minimized. The ac current component can then be determined using the resulting current signal.

After the capacitive portion of the ac component is removed in block 526, the resistive component $I''_{AC}$ (or the corresponding pseudo-impedance $Z''_{AC}$) is then trended in block 528.

The analysis in block 530, extracts the average current signal at a predetermined frequency of the motor (shown for example as signal $I_{COM}$ at the commutation frequency). If the predetermined frequency is the commutation (rotor bar-passing) frequency, this frequency is proportional to and can be calculated from the motor speed by conventional techniques. The current signal is then extracted at the predetermined frequency. Block 532 then trends the resulting signal or its corresponding pseudo-impedance as discussed above to determine whether there is a developing problem in the motor.

The amplitude and phase of an ac component at a predetermined frequency (or a dc component—at zero frequency) can be determined either by using a traditional method as a Fourier Transform (like, e.g., a Discrete Fourier Transform, DFT, or its fast implementation, the Fast Fourier Transform or FFT), which is used to derive the full spectrum of the current or voltage, or by computing directly a single inner product in the vector space of functions of finite energy in the interval of zero to T of the form:

$$s(f) = 1/T * \int_0^T x(t) e^{-j f 2\pi t} dt,$$

where x(t) denotes the considered current or voltage signal, f is the predetermined frequency of the ac component (the amplitude and phase of which the equation will determine) or zero for the dc component, and T denotes the length of the considered interval. The resulting number s(f) is, for an ac component, a complex number which represents amplitude and phase of the sought-for ac component. In order to minimize the influence of other signal components on the result, T is preferably a multiple of 1/f.

For sampled/digitized data the corresponding expression of the inner product in N-dimensional vector space reads:

$$s(f)=1/N * \Sigma_{k=0}^{N-1} x(k*\Delta t) e^{-jf2\pi k\Delta t},$$

where $(1/\Delta t)$ is the sampling rate of the data, and N preferably is again chosen such that $N\Delta t$ is a multiple of $(1/f)$.

Both of the above expressions compute the amplitude and phase of an ac component of a predetermined frequency f (of a current or voltage signal) without having to compute the full spectrum. If only a few predetermined frequencies are used, then this approach may be computationally less expensive than performing a full FFT. In addition, if the considered frequencies are all multiples of $(1/N\Delta t)$, then the values s(f) are identical to the corresponding coefficients computed using a DFT, or its fast implementation, the FFT (up to the numerical precision of the processor).

If in above calculations a different interval length is considered (i.e., T or $N\Delta t$, respectively, is not a multiple of $1/f_i$, for every considered frequency $f_i$), and the amplitude and phase of M different ac components at frequencies $f_1$, $f_2$, ..., $f_M$ is needed, then, in order to minimize the influence of other signal components on the result (i.e., in order to decorrelate the considered signal components from each other), the following vector (which comprises complex amplitudes, i.e. amplitudes and phases, for all considered signal components) can be calculated:

$$r = A^{-1} s,$$

where $s=(s(f_1), s(f_2), \ldots, s(f_M))^T$ and $r=(r(f_1), r(f_2), \ldots, r(f_M))^T$. The component $r(f_i)$ of the vector r is a complex number which represents amplitude and phase of the ac component at frequency $f_i$, and the MxM matrix $A=(a_{mn})_{m,n=1\ldots M}$ is given by:

$$a_{mn} = 1/T * \int_0^T e^{jfm2\pi t} e^{-jfn2\pi t} dt,$$

or $$a_{mn} = 1/N * \Sigma_{k=0}^{N-1} e^{jfm2\pi k\Delta t} e^{-jfn2\pi k\Delta t},$$

respectively. When used in a situation where multiple components are extracted, the vector is preferably chosen to comprise all of the extracted components (including any dc component that is extracted), not just the particular components that do not have a frequency such that the considered interval is a multiple of $1/f_i$.

In another embodiment, the dc ripple current could alternatively or additionally be extracted and trended to back up the conclusions from the dc component or to draw conclusions about a system rectifier. In a related embodiment, the voltage from voltage sensor 412 can be used to obtain a representative impedance for impedance trending.

When a pseudo-impedance is used in any of the above trending embodiments, the trending is identified with an electrical system or locomotive mode since the impedances will be different depending on whether system motors or braking grids are connected, for example. That is, trending is generally done separately for each operating mode.

Interference signals may be minimized by deriving and using the fundamental components of the current and voltage. By using the fundamental components, most interfering sources will be excluded. This may conveniently be done so that phase is preserved, for example, using a complex fourier transform or other component extraction methods as discussed above. The extraction of fundamentals (and other critical components of the spectrum like dc, ripple and bar passing) will occur after acquisition and before further processing in the alternate analysis paths. Such methods may be usefully exploited in complicated systems where there is more than one type of electrical device connected. A good example of such a system is a dc locomotive.

While only certain preferred features of the invention have been illustrated and described, many modifications, changes and substitutions will occur to those skilled in the art. It is, therefore, to be understood that the appended claims are intended to cover all such modifications and changes as fall within the true spirit of the invention.

What is claimed is:

1. An apparatus for predicting incipient faults in an electrical system including an electric machine, comprising:
   a leakage sensor determining a neutral-to-ground leakage signal representative of current or voltage between a neutral point of the machine and an electrical ground; and
   a processor receiving the leakage signal, extracting at least one component of the leakage signal, and using the extracted signal component to predict incipient faults in at least one portion of the electrical system.

2. The apparatus of claim 1 further including at least one machine voltage sensor sensing at least one machine voltage selected from the machine voltage group consisting of at least one line-to-neutral voltage $V_{LN}$ of the machine, and at least one line-to-line voltage $V_{LL}$ of the machine, wherein the processor normalizes the extracted signal component to the at least one machine voltage yielding a representative leakage impedance and examines the representative leakage impedance over time to predict the incipient faults.

3. The apparatus of claim 1 further including at least one machine voltage sensor sensing at least one machine voltage selected from the machine voltage group consisting of at least one line-to-neutral voltage $V_{LN}$ of the machine, and at least one line-to-line voltage $V_{LL}$ of the machine, wherein the processor calculates a common mode voltage from the at least one machine voltage, normalizes the extracted signal component to the common mode voltage yielding a representative leakage impedance, and examines the representative leakage impedance over time to predict the incipient faults.

4. The apparatus of claim 1 wherein the processor extracts a dc signal component of the leakage signal, and trends the dc signal component over time to predict the incipient faults.

5. The apparatus of claim 1 further including at least one machine voltage sensor sensing at least one machine voltage selected from the machine voltage group consisting of at least one line-to-neutral voltage $V_{LN}$ of the machine, and at least one line-to-line voltage $V_{LL}$ of the machine, wherein the processor extracts a dc signal component of the leakage signal, uses the dc signal component and the at least one machine voltage to determine a representative dc leakage impedance, and examines a quantity proportional to the representative dc leakage impedance over time to predict the incipient faults in a dc portion of the electrical system.

6. The apparatus of claim 1 wherein the processor extracts an ac signal component of the leakage signal, and trends the ac signal component over time to predict the incipient faults.

7. The apparatus of claim 1 further including at least one machine voltage sensor sensing at least one machine voltage selected from the machine voltage group consisting of at least one line-to-neutral voltage $V_{LN}$ of the machine, and at least one line-to-line voltage $V_{LL}$ of the machine, wherein the processor extracts an ac signal component of the leakage signal, uses the ac signal component and the at least one machine voltage to determine a representative ac leakage impedance, and examines a quantity proportional to the representative ac leakage impedance over time to predict the incipient faults in an ac portion of the electrical system.

8. The apparatus of claim 1 wherein the processor extracts ac and dc components of the leakage signal, and separately trends the ac and dc components over time to predict the incipient faults.

9. The apparatus of claim 1 wherein the processor extracts a resistive component of the leakage signal and uses the resistive component to predict the incipient faults.

10. The apparatus of claim 9 wherein the processor extracts the resistive component of the leakage signal along an axis identified by a predetermined angle obtained from evaluating a neutral-to-ground voltage under good operating conditions of the electrical system.

11. The apparatus of claim 9 further including at least one machine voltage sensor sensing at least one machine voltage selected from the machine voltage group consisting of at least one line-to-neutral voltage $V_{LN}$ of the machine, and at least one line-to-line voltage $V_{LL}$ of the machine, wherein the processor calculates a common mode voltage from the at least one machine voltage, and wherein the processor extracts the resistive component by tracking a portion of the leakage signal which is in phase with the common mode voltage.

12. The apparatus of claim 9 further including at least one machine voltage sensor sensing at least one machine voltage selected from the machine voltage group consisting of at least one line-to-neutral voltage $V_{LN}$ of the machine, and at least one line-to-line voltage $V_{LL}$ of the machine, wherein the processor extracts the resistive component by varying the leakage signal until a single line voltage of the at least one machine voltage is minimized.

13. The apparatus of claim 1 wherein the processor extracts the extracted signal component at a predetermined frequency and trends the extracted signal component over time to predict the incipient faults.

14. The apparatus of claim 13 wherein the predetermined frequency comprises a predetermined frequency of the machine or a predetermined frequency of another portion of the electrical system.

15. The apparatus of claim 1 further including at least one machine voltage sensor sensing at least one machine voltage selected from the machine voltage group consisting of at least one line-to-neutral voltage $V_{LN}$ of the machine, and at least one line-to-line voltage $V_{LL}$ of the machine, wherein the processor extracts the extracted signal component at a predetermined frequency, uses the extracted signal component and the at least one machine voltage to determine a representative leakage impedance, and examines a quantity proportional to the representative leakage impedance over time to predict the incipient faults.

16. The apparatus of claim 1 wherein the processor derives fundamental components of the leakage signal and the at least one machine voltage to localize the incipient faults and substantially exclude outside interference sources from the prediction of the incipient faults.

17. The apparatus of claim 1 wherein the processor uses an inner product to extract an amplitude of a dc component of the leakage signal or an amplitude and a phase of at least one ac component of the leakage signal.

18. The apparatus of claim 17 wherein the processor further uses a decorrelating matrix to extract the amplitude of the dc component of the leakage signal or the amplitude and the phase of the at least one ac component of the leakage signal.

19. The apparatus of claim 1 wherein the processor predicts the incipient faults using the extracted signal component or a representative impedance based trending, such that the extracted signal component or the representative impedance H is monitored for any increase by computing at least one of the following equations:

$$a_1(k)=H(k)/H(k-1)$$

and $$a_2(k)=H(k)-H(k-1),$$

to determine a value of a ratio $a_1(k)$ and/or the difference $a_2(k)$, where $H(k)$ is a sampling of the extracted signal component or the representative impedance at sampling index time k, and $H(k-1)$ is a sampling of the extracted signal component or the representative impedance at a predetermined time period earlier.

20. The apparatus of claim 19 wherein the processor further evaluates at least one of the following corresponding equations:

if $a_1(k)=a_1(k-1)\pm\epsilon_1$ for k=m to n, then the ratio is relatively constant, and if $a_2(k)=a_2(k-1)\pm\epsilon_2$ for k=m to n, then the difference is relatively constant, to determine whether the ratio $a_1(k)$ and/or the difference $a_2(k)$ is remaining relatively constant, where (m<n) and m and n generally are integer multiples of a sampling time defining a time span including a plurality of sample points.

21. The apparatus of claim 19 wherein the processor further evaluates at least one of the following corresponding equations:

if $a_1(k)/a_1(k-1)>1+\beta_1$, for k=m to n, then the ratio is increasing at an accelerating rate, and if $a_2(k)/a_2(k-1)>1+\beta_2$, for k=m to n, then the difference is increasing at an accelerating rate, to determine whether the ratio $a_1(k)$ and/or difference $a_2(k)$ is increasing at an accelerated rate.

22. The apparatus of claim 1 wherein the processor determines the incipient faults using fault log based analysis, such that type, frequency and rate of fault logs are trended for a particular unit and used to incipiently predict the approach of a fault occurrence based on the processor evaluating at least one of the following equations:

for $d_1(j)=F(j)/F(j-1)$, is $d_1(j)<=1+\alpha$ for a preselected number of samples, for $d_2(j)=F(j)-F(j-1)$, is $d_2(j)<=1+\alpha$ for a preselected number of samples, where j is an index of fault log occurrences; $F(j)$ represents a time period the electrical system was operational between a present (jth) fault log and a previous (j−1th) fault log; $F(j-1)$ represents a time period the electrical system was operational between two previous fault logs (the j−1th and j−2th fault logs); $d_1(j)$ represents a ratio trending coefficient of $F(j)$ and $F(j-1)$; $d_2(j)$ represents a difference trending coefficient of $F(j)$ and $F(j-1)$.

23. An apparatus for predicting an incipient fault in an electrical system including an electric machine, comprising:

a leakage sensor determining a neutral-to-ground leakage signal representative of current or voltage between a neutral point of the machine and an electrical ground; and a processor periodically receiving the leakage signal, normalizing the leakage signal to a machine voltage yielding a representative leakage impedance, and examining a resulting plurality of data points of the representative leakage impedance over time to predict the incipient fault.

24. The apparatus of claim 23 wherein the processor averages the data points;
forms the averaged data points into overlapping windows; and
in each window, uses the averaged data points to estimate regression model parameters and uses the regression model parameters to forecast a time at which the incipient fault will occur.

25. The apparatus of claim 24 wherein, the processor preprocesses the data points to reduce transient effects and noise prior to averaging the data points.

26. The apparatus of claim 25 wherein, the processor preprocesses the data points by median trimming the data points.

27. The apparatus of claim 24 wherein the processor determines an accuracy of the forecasted time.

28. The apparatus of claim 27 wherein the processor determines the accuracy by using the regression model parameters to determine a variance or confidence region of the forecasted time.

29. An apparatus for predicting an incipient fault in an electrical system including an electric machine, comprising:
a leakage sensor determining a neutral-to-ground leakage signal representative of current or voltage between a neutral point of the machine and an electrical ground; and
a processor receiving a plurality of data points of the leakage signal over time to predict the incipient fault by averaging the data points;
forming the averaged data points into overlapping windows; and
in each window, using the averaged data points to estimate regression model parameters and using the regression model parameters to forecast a time at which the incipient fault will occur.

30. The apparatus of claim 29 wherein, the processor preprocesses the data points to reduce transient effects and noise prior to averaging the data points.

31. The apparatus of claim 30 wherein, the processor preprocesses the data points by median trimming the data points.

32. The apparatus of claim 29 wherein the processor determines an accuracy of the forecasted time.

33. The apparatus of claim 32 wherein the processor determines the accuracy by using the regression model parameters to determine a variance or confidence region of the forecasted time.

34. An apparatus for detecting incipient failure in an electrical system, the apparatus comprising a processor for using fault log based analysis, such that fault logs are created to include type, frequency and rate of fault and are trended for the electrical system to incipiently predict the approach of a failure by evaluating at least one of the following equations:

for $d_1(j)=F(j)/F(j-1)$, is $d_1(j)<=1+\alpha$ for a preselected number of samples?, and for $d_2(j)=F(j)-F(j-1)$, is $d_2(j)<=1+\alpha$ for a preselected number of samples?, where j is an index of fault log occurrences; $F(j)$ represents a time period the electrical system was operational between a present (jth) fault log and a previous (j-1th) fault log; $F(j-1)$ represents a time period the electrical system was operational between two previous fault logs (the j-1th and j-2th fault logs); $d_1(j)$ represents a ratio trending coefficient of $F(j)$ and $F(j-1)$; $d_2(j)$ represents a difference trending coefficient of $F(j)$ and $F(j-1)$.

35. An apparatus for predicting incipient faults in an electrical system, comprising:
a current sensor sensing a current of the electrical system;
a processor trending the current to predict incipient faults in at least one component of the electrical system by computing at least one of the following equations:

$$a_1(k)=I(k)/I(k-1)$$

and $$a_2(k)=I(k)-I(k-1),$$

to determine a value of a ratio $a_1(k)$ and/or the difference $a_2(k)$, where $I(k)$ is a sampling of the current at sampling index time k, and $I(k-1)$ is a sampling of the current at a predetermined time period earlier.

36. The apparatus of claim 35 wherein the processor further computes at least one of the following corresponding equations:

if $a_1(k)=a_1(k-1)\pm\epsilon_1$ for k=m to n, then the ratio is relatively constant, and if $a_2(k)=a_2(k-1)\pm\epsilon_2$ for k=m to n, then the difference is relatively constant, to determine whether the ratio $a_1(k)$ and/or the difference $a_2(k)$ is remaining relatively constant, where (m<n) and m and n generally are integer multiples of a sampling time defining a time span including a plurality of sample points.

37. The apparatus of claim 35 wherein the processor further computes at least one of the following corresponding equations:

if $a_1(k)/a_1(k-1)>1+\beta_1$, for k=m to n, then the ratio is increasing at an accelerating rate, and if $a_2(k)/a_2(k-1)>1+\beta_2$, for k=m to n, then the difference is increasing at an accelerating rate, to determine whether the ratio $a_1(k)$ and/or difference $a_2(k)$ is increasing at an accelerated rate.

38. An apparatus for predicting incipient faults in an electrical system, comprising:
a current sensor sensing a current of the electrical system;
a voltage sensor sensing at least one voltage of the electrical system;
a processor receiving input signals representing the leakage current and the at least one voltage, using the input signals to calculate a representative impedance, and trending the representative impedance to predict incipient faults in at least one component of the electrical system by computing at least one of the following equations:

$$a_1(k)=Z(k)/Z(k-1)$$

and $$a_2(k)=Z(k)-Z(k-1),$$

to determine a value of a ratio $a_1(k)$ and/or the difference $a_2(k)$, where $Z(k)$ is a sampling of the representative impedance at sampling index time k, and $Z(k-1)$ is a sampling of the representative impedance at a predetermined time period earlier.

39. A method for predicting incipient faults in an electrical system including an electric machine, comprising:

determining a neutral-to-ground leakage signal representative of current or voltage between a neutral point of the machine and an electrical ground; and processing the leakage signal by extracting at least one component of the leakage signal and using the at least one extracted signal component to predict incipient faults in at least one portion of the electrical system.

40. The method of claim 39 wherein the at least one extracted signal component is a dc signal component of the leakage signal, an ac signal component of the leakage signal, a resistive component of the leakage signal, or an extracted signal component at a predetermined frequency.

41. The method of claim 39 wherein the processor uses an inner product to extract an amplitude and a phase of at least one ac component of the leakage signal.

42. The method of claim 39 wherein the processor uses an inner product to extract an amplitude of a dc component of the leakage signal.

43. A method for predicting an incipient fault in an electrical system including an electric machine, comprising:

determining a neutral-to-ground leakage signal representative of current or voltage between a neutral point of the machine and an electrical ground; and periodically normalizing the leakage signal to a machine voltage yielding a representative leakage impedance and examining a resulting plurality of data points of the representative leakage impedance over time to predict the incipient fault.

44. The method of claim 43 wherein examining a resulting plurality of data points comprises:

averaging the data points;

forming the averaged data points into overlapping windows; and in each window, using the averaged data points to estimate regression model parameters and using the regression model parameters to forecast a time at which the incipient fault will occur.

45. The method of claim 44 further including determining an accuracy of the forecasted time by using the regression model parameters to determine a variance or confidence region of the forecasted time.

46. A method for predicting an incipient fault in an electrical system including an electric machine, comprising:

determining a neutral-to-ground leakage signal representative of current or voltage between a neutral point of the machine and an electrical ground; and predicting the incipient fault by averaging a plurality of periodically determined data points of the leakage signal over time;

forming the averaged data points into overlapping windows; and in each window, using the averaged data points to estimate regression model parameters and using the regression model parameters to forecast a time at which the incipient fault will occur.

47. The method of claim 46 wherein further including determining an accuracy of the forecasted time by using the regression model parameters to determine a variance or confidence region of the forecasted time.

48. A method for detecting incipient failure in an electrical system using fault log based analysis, such that fault logs are created to include type, frequency and rate of fault and are trended for the electrical system to incipiently predict the approach of a failure by evaluating at least one of the following equations:

for $d_1(j)=F(j)/F(j-1)$, is $d_1(j)<=1+\alpha$ for a preselected number of samples?, and for $d_2(j)=F(j)-F(j-1)$, is $d_2(j)<=1+\alpha$ for a preselected number samples?, where j is an index of fault log occurrences; F(j) represents the time period the electrical system was operational between the present (jth) fault log and the previous (j−1th) fault log; F(j−1) represents the time period the electrical system was operational between the two previous fault logs (the j−1th and j−2th fault logs); $d_1(j)$ represents the ratio trending coefficient of these time periods; and $d_2(j)$ represents the difference trending coefficient of these time periods.

49. A method for predicting incipient faults in an electrical system, comprising:

sensing a current of the electrical system;

trending the current to predict incipient faults in at least one component of the electrical system by computing at least one of the following equations:

$a_1(k)=I(k)/I(k-1)$ and $a_2(k)=I(k)-I(k-1)$, to determine a value of a ratio $a_1(k)$ and/or the difference $a_2(k)$, where I(k) is a sampling of the current at sampling index time k, and I(k−1) is a sampling of the current at a predetermined time period earlier.

* * * * *